(12) United States Patent
Tanaka et al.

(10) Patent No.: US 6,660,438 B2
(45) Date of Patent: Dec. 9, 2003

(54) METHOD OF MANUFACTURING AN ELECTRONIC DEVICE AND A SEMICONDUCTOR INTEGRATED CIRCUIT DEVICE

(75) Inventors: Toshihiko Tanaka, Tokyo (JP); Norio Hasegawa, Hinode (JP)

(73) Assignee: Hitachi, Ltd., Tokyo (JP)

( * ) Notice: Subject to any disclaimer, the term of this patent is extended or adjusted under 35 U.S.C. 154(b) by 91 days.

(21) Appl. No.: 09/983,172

(22) Filed: Oct. 23, 2001

(65) Prior Publication Data

US 2002/0051943 A1 May 2, 2002

(30) Foreign Application Priority Data

Nov. 1, 2000 (JP) ........................................ 2000-334366

(51) Int. Cl.$^7$ ................................................. G03F 9/00
(52) U.S. Cl. ........................................ 430/22; 430/311
(58) Field of Search ................................ 430/22, 5, 311

(56) References Cited

FOREIGN PATENT DOCUMENTS

| JP | 5-181257 | 7/1993 |
|---|---|---|
| JP | 5-289307 | 11/1993 |
| JP | 9-211837 | 8/1997 |

*Primary Examiner*—Christopher G. Young
(74) *Attorney, Agent, or Firm*—Miles & Stockbridge P.C.

(57) ABSTRACT

A method of manufacturing an electronic device, such as a high-speed semiconductor integrated circuit device, with improved dimensional accuracy in transferring fine patterns.

Photolithography for gate patterns and wiring patterns is carried out by exposing a halftone phase-shift mask having shade areas made of resist with an oblique illumination system, and photolithography for contact hole patterns is carried out by using a photomask having a metal shade film with metal alignment wafer marks.

26 Claims, 11 Drawing Sheets

METHOD OF MANUFACTURING AN ELECTRONIC DEVICE AND A SEMICONDUCTOR INTEGRATED CIRCUIT DEVICE

BACKGROUND OF THE INVENTION

1. Field of the Invention

The present invention relates to a method of manufacturing an electronic device having fine patterns, more particularly to a method of manufacturing a semiconductor integrated circuit device having a plurality of fine circuit patterns.

2. Prior Art

In the manufacture of semiconductor integrated circuit devices, repetitive use is made of an epitaxial process such as a chemical vapor deposition (CVD) process, a doping process such as ion implantation, a lithographic process, and an etching process. The operation speed and integration density of semiconductor integrated circuit devices can be effectively improved by miniaturizing the circuit patterns and enhancing the dimensional accuracy, as has increasingly been done in recent years. The miniaturization of circuit patterns mainly depends on lithography, so lithography plays a vital role in the manufacture of semiconductor integrated circuit devices.

Lithographic technology mainly employs a projection aligner that forms device patterns by transferring the pattern of a photomask mounted in the projection aligner to the surface of a semiconductor wafer. At this time, the exposure area of a high-resolution projection aligner is smaller than the area of a semiconductor wafer, so the exposure is divided into a plurality of shots which are stepped or scanned to repeat the exposure of the chip area a plurality of times. The size of a chip depends on the product to be made, so a photomask is, in general, provided with an outer frame referred to as a shade area made of a metal such as chromium (Cr) so that a desired shot size can be obtained. In this way, the single chip areas exposed by the plurality of shots are prevented from overlapping, and a scribe area is provided around the edge of each chip for dicing.

The need for higher integration and faster device operation has led to the increasing miniaturization of the patterns formed by lithography in recent years. In this context, research and development aimed at shortening the wavelength of exposure light used for exposing patterns in an optical aligner are being pursued.

Furthermore, a halftone phase-shifting exposure method is now being used. A halftone phase-shift mask is a translucent film (referred to as a halftone film) formed on a transparent plate to dim the exposure light and shift its phase. In general, a transmittance in the range of 1% to 25% of the exposure light is considered desirable.

Exposure light which passes through a halftone film is phase shifted with respect to exposure light which does not pass thorough the film. Either a single layer or a multi-layer halftone film can be used to produce the phase difference. Although phase differences of 180° and odd multiples thereof are needed to obtain the highest resolution, other phase differences within a range of 180°±90° are also effective in improving resolution. It is known that use of a halftone mask can improve the resolution by about 5% to 20%.

Descriptions of halftone phase-shifting can be found, for example, in documents such as JP-A No. H5-181257.

As described above, a halftone phase-shifting method is known as an exposure method that can resolve fine-dimensioned patterns with high resolution. This exposure method, however, has many problems as described below, making it difficult to obtain sufficient pattern transferring accuracy.

The halftone phase-shifting method causes interference between exposure light which has passed through the halftone part and exposure light which has passed through apertures therein, in the vicinity of the boundaries of the apertures and the halftone part, to enhance the optical contrast, thereby improving the resolution and exposure tolerances. For this reason, it is very critical to control the amount of exposure light passing through the halftone part, or the transmittance of the halftone part, and the amount of the phase shift.

In addition, the dimensional accuracy of the halftone film pattern has a profound effect on the dimensional accuracy of the transferred pattern. For a fine pattern near the resolution limit of the projection lens, the optical contrast becomes substantially lower due to light diffraction which, together with a factor referred to as the mask error enhancement factor (MEF), makes the dimensional accuracy of the transferred pattern lower than that of the pattern on the mask. The MEF is an indicator showing the amplification of the dimensional difference $\Delta Lm$ of a transferred pattern in relation to the dimensional difference $\Delta Lw$ of the pattern on a mask, and is given by the equation $MEF=\Delta Lm/(M \cdot \Delta Lw)$, where M is the reduction factor of the projection lens. If a 5× lens is used, then M is ⅕. In a case with a fine pattern using a halftone phase-shift mask, the pattern is generally transferred with an MEF of 2 to 3, so that unwanted variations in the dimensions of the pattern on the mask are amplified by a factor of 2M to 3M.

In the manufacturing processes of a semiconductor integrated circuit device, a step that requires particularly high dimensional accuracy in a fine pattern is the patterning step for the gate electrodes of transistors. As the dimensions of the gate electrodes become smaller, the operation speed of the transistors becomes higher. High dimensional accuracy of the gate electrodes enables stable operation of the circuit and thus enables high-speed circuits to work together, consequently increasing the added value of a semiconductor integrated circuit device. In addition, if fine patterns can be formed with higher accuracy in the wiring patterning process, interconnection wirings can result in a higher packing density and shorter length, which also contribute to high-speed circuit operation and a higher integration density.

However, if the conventional halftone phase-shift exposure method is adopted for extremely fine gate, wiring, and hole patterning processes, there is a problem in that sufficient dimensional accuracy cannot be obtained due to the inadequate controllability of the phase and transmittance of the halftone phase-shift mask and variations of dimensions on the mask, and consequently the reproducibility and yield of the manufacturing process cannot be improved.

SUMMARY OF THE INVENTION

It is an object of this invention to provide an improved method of manufacturing an electronic device having fine dimensional patterns.

It is another object of this invention to provide an improved method of manufacturing a semiconductor circuit device having fine circuit patterns, so that higher integration levels and higher-speed operation can be obtained.

It is a further specific object of this invention to provide an improved method of manufacturing a high-speed, highly integrated semiconductor integrated circuit device by forming fine patterns for gate electrodes, wirings, and holes with better dimensional accuracy.

Typical aspects of the invention disclosed herein will be described below. Although the following description focuses on a method of manufacturing a semiconductor integrated circuit device, the invention is also applicable to methods of manufacturing other electronic devices having extremely fine patterns, such as liquid crystal display devices, micro machines, and superconductive devices. In accordance with a first aspect of the invention, a mask having shade areas made of resist external to the halftone phase-shift pattern is used to expose a photosensitive film provided on the surface of a workpiece such as a semiconductor wafer with an oblique illumination system to transfer a fine pattern.

The mask or other workpiece is exposed by stepping or scanning the exposure shots, thus repeating the exposure a plurality of times, in such a way that the resist shade areas are transferred in a partially overlapping manner. This makes it possible to transfer fine patterns with high accuracy to a plurality of adjacent areas on a photosensitive film provided on the main surface of the workpiece and thereby form electronic devices such as semiconductor integrated circuit devices.

The resist shade area of the first aspect of the invention is formed outside the areas in which circuit patterns having halftone characteristics are disposed, whereby overlapping exposure of those areas during the plurality of exposure shots can effectively be prevented.

In addition, although the halftone phase-shift pattern may be constructed by providing projections and depressions on a transparent plate surface, in order to form a finer pattern with higher accuracy and better reproducibility, it is more desirable to deposit a halftone film on the surface of the transparent plate and pattern the film. A halftone phase-shift pattern constructed with a halftone film can offer improved mutual alignment accuracy of the halftone phase-shift mask and work piece, or wafer, if alignment marks are provided for reference on the halftone film.

In accordance with a second aspect of the invention, an electronic device such as a semiconductor integrated circuit device is fabricated as follows: in forming fine holes with dimensions that are not expanded too much two-dimensionally (that is, in the x and y directions) in a dielectric film on the main surface of the wafer to attach electrode terminals extending to the semiconductor area in the wafer, or to form interconnections between wiring layers, a first fine pattern transferring process is performed, which transfers a fine hole pattern to a plurality of adjacent areas on a first photosensitive film provided on the main surface of the wafer by repeatedly stepping or scanning an exposure using a first halftone phase-shift mask with a shade area made of chromium or another metal surrounding a halftone phase-shift pattern corresponding to the fine hole pattern, or a so-called binary mask with a pattern corresponding to the fine hole pattern that is formed by a shade film; in forming narrow or rectangular fine patterns disposed in close proximity to each other, such as gate electrode patterns and wiring patterns, (that is, a plurality of patterns at least having larger longitudinal dimensions than the hole pattern mentioned above, in other words, a plurality of patterns that extend farther in the x or y direction than the hole pattern mentioned above), a second fine pattern transferring process is performed, which transfers a fine wiring pattern to a plurality of adjacent areas on a second photosensitive film provided on the main surface of the wafer by repeating oblique illumination exposure shots a plurality of times with a stepper or a scanner using a second halftone phase-shift mask with a shade area made of resist external to the halftone phase-shift pattern formation area corresponding to the fine pattern.

Furthermore, in the second aspect of the invention, the alignment accuracy of the first mask for forming the fine hole pattern and the second mask for forming the slim electrode and the wiring pattern with respect to the workpiece such as a wafer can be improved by forming the alignment marks of the first mask in the chromium or other metal shade film and the alignment marks of the second mask in the halftone film surrounded by the resist shade area. That is, a fine circuit pattern can be formed with higher dimensional accuracy and higher alignment accuracy thorough lithography by using either a halftone phase-shift mask with a shade area made of resist or a metal shade area mask with alignment wafer marks formed by metal, or both, according to the type of fine patterns to be formed; that is, gate electrodes, wiring, or holes.

Furthermore, in accordance with a third aspect of the invention, the mask used in the first aspect of the invention described above can be made to have no resist material in the fine pattern formation area, so it is possible to form a resist band-like shade area with resist material that fluoresces in response to incident light and easily inspect resist residue defects in the fine pattern part by irradiating the area with inspection light, thereby improving production yields of electronic devices.

In addition, in accordance with another aspect of the invention, it is possible to effectively prevent contamination of fine pattern masks and electronic devices by performing exposure processing by using a mask with a resist shade film formed outside the fine pattern formation area and using the outer region of a mask plate having no resist film to be mounted on the supporter of an aligner and transportation means for transporting the mask, thereby keeping the resist material from coming in contact therewith.

When adopted in the fine patterning processes for gate electrodes, holes, and wiring, the various manufacturing methods of the present invention described above can improve reproducibility and yields in the manufacture of electronic devices such as high-density semiconductor integrated circuit devices.

In order to make the manufacturing process of photomasks easier and more accurate, for example, JP-A No. H5-289307 has disclosed a method of forming a mask pattern with a resist film. This mask is a so-called binary mask comprising exposure light transmitting parts and shade parts with sufficiently low transmittance, which inherently has no problem of overlapping exposure shots.

An example of the use of resist shade areas in a halftone phase-shift mask is found in JP-A No. H9-211837, which prevents sub-peak transfer when circuit patterns are formed, and forms a so-called rim-type halftone mask in which only areas close to the pattern edge are half-toned.

This invention differs in its objects and effects from these methods and also differs in the locations at which resist films are formed.

This invention enables fine patterns to be formed with higher dimensional accuracy and alignment accuracy, making it possible to manufacture electronic devices, such as higher-speed and highly integrated semiconductor integrated circuit devices, with better reproducibility.

DETAILED DESCRIPTION OF THE PREFERRED EMBODIMENTS

First Embodiment

Figure 1:
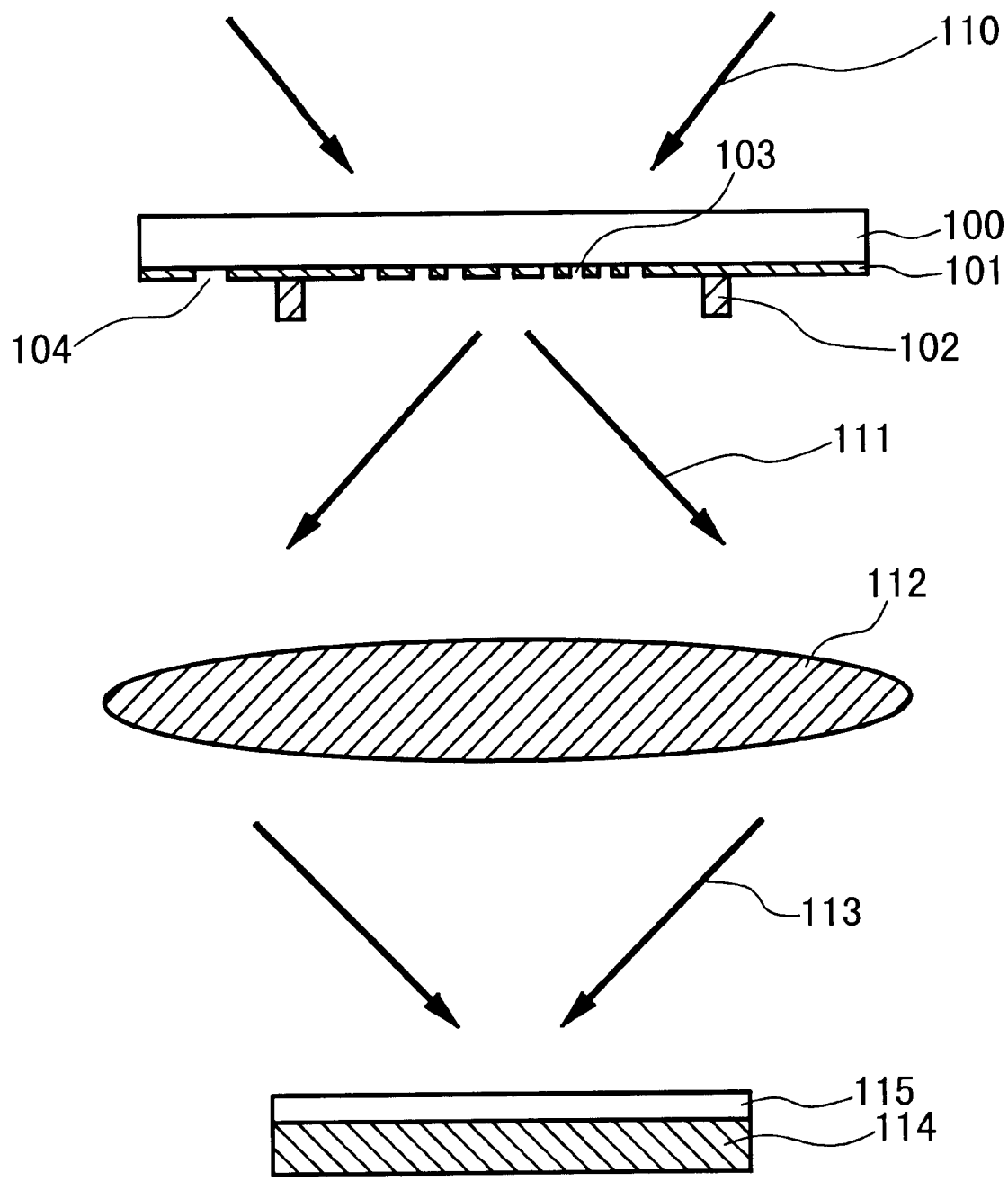
FIG. 1 is a conceptual drawing showing an overview of an exposure method used in the invention.

Methods of manufacturing an electronic device such as a semiconductor integrated circuit device according to the present invention will now be described in detail.

An exposure process for transferring a fine pattern will be described with reference to the schematic sectional view of part of an aligner shown in FIG. 1, in which reference numeral 100 indicates an optically transmissive plate made of quartz glass, reference numeral 101 indicates a halftone film, reference numeral 102 indicates a shade area made of a resist film, reference numeral 103 indicates a fine circuit pattern to be transferred that is formed in the halftone film 101, reference numeral 104 indicates a reticle alignment mark, reference numeral 110 indicates obliquely incident exposure light (off axis illumination light) from an ArF excimer laser, reference numeral 111 indicates diffracted light, reference numeral 112 indicates a projection lens, reference numeral 113 indicates projected light, reference numeral 114 indicates a wafer, and reference numeral 115 indicates a photosensitive film (a resist film, referred to as a photosensitive film to distinguish it from the resist film 102 that forms the shade area) which is applied to the main surface of the wafer 114.

As shown in FIG. 1, so-called sub-peak, a phenomenon in which exposure light strength peaks under a halftone film during exposure due to interference with light incident on adjacent apertures in the halftone film, can be prevented by exposing a halftone phase-shift mask having a resist shade area 102 to obliquely incident exposure light (that is, to off axis illumination) through the optically transmissive plate 100, which is placed parallel to and facing the main surface of the wafer 114, and the depth of focus can be improved, so the process is extremely effective as a method of exposing and transferring fine patterns according to the present invention.

As shown in the drawing, a predetermined area in the photosensitive film (resist film) 115 deposited on the main surface of the wafer 114, such as a chip area of a single semiconductor integrated circuit, is exposed with ArF excimer laser light obliquely incident from the back of the optically transmissive plate 100, the back side being the side without the fine circuit pattern 103.

Figure 9:
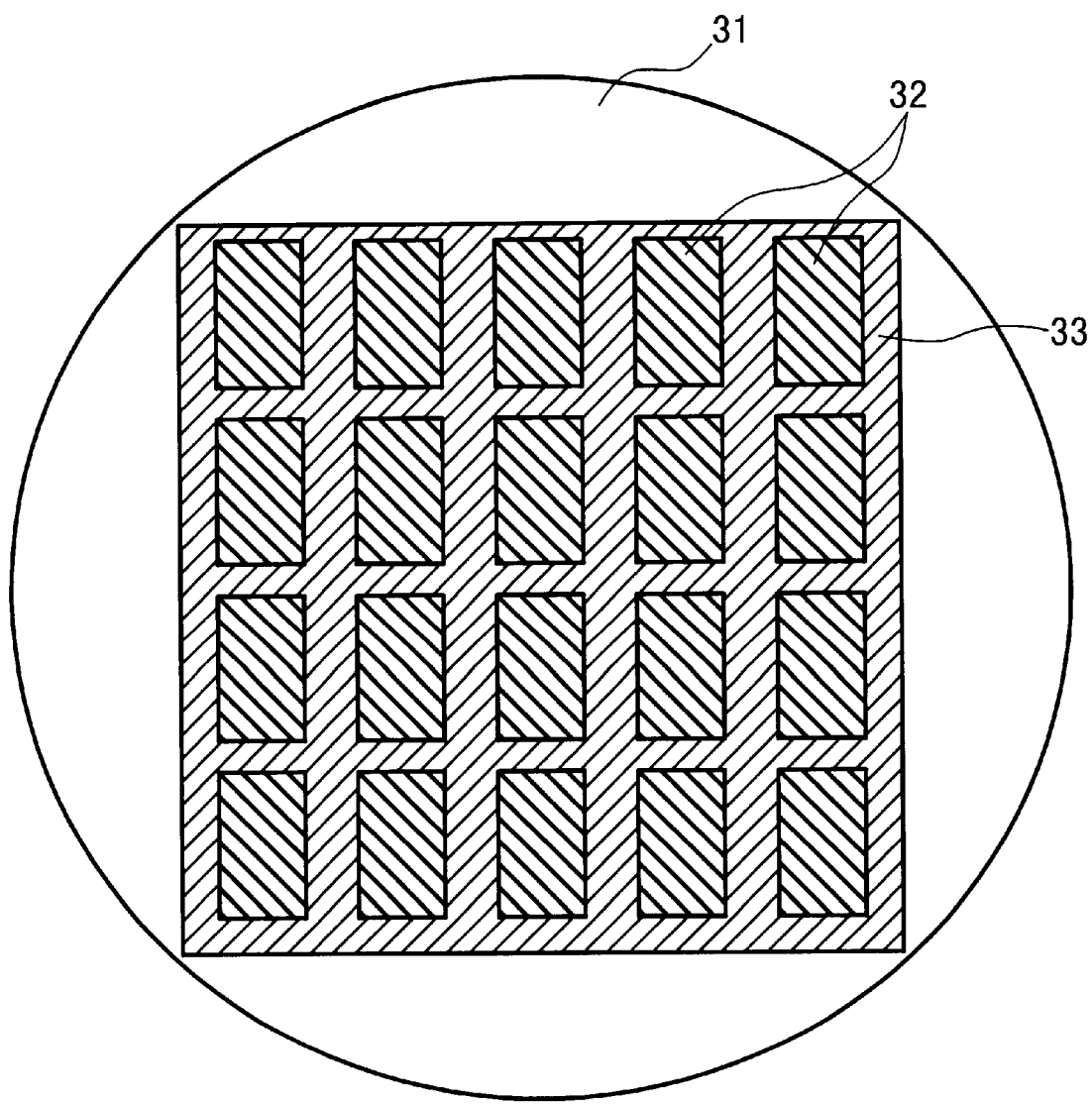
FIG. 9 is a plan view of part of a semiconductor wafer for describing a method of manufacturing a semiconductor integrated circuit device according to the invention.

Next, the exposure process (one exposure shot) is repeated consecutively a plurality of times by stepping or scanning the mask or the wafer in the x and y directions in such a way that the resist shade area is transferred in a partially overlapping manner, until the exposure process has covered the entire photosensitive film (resist film) 115 on the main surface of a large wafer as shown in FIG. 9. FIG. 9 is a schematic plan view of a wafer to be exposed, in which reference numeral 31 indicates the wafer, reference numeral 32 indicates a plurality of chip areas, and reference numeral 33 indicates a scribe area for dicing and separating the chips.

With a high-resolution aligner with high accuracy, it is effective if, instead of exposing the whole surface of a wafer at one time, immediately after the completion of the exposure of a small exposure area (e.g. one corresponding to an area occupied by a single chip) under preset exposure conditions as mentioned above, an area just adjacent to that area is exposed under the same conditions, and this process is repeated in the x and y directions a plurality of times (that is, the exposure is divided into a plurality of shots and repeated).

Because the chip size depends on the product to be made, the resist shade area 102, which forms the outer frame of the mask pattern, is used to obtain a desired shot size (to define the exposure area for one shot) and prevent overlapping exposure of the fine pattern formation area surrounded by the resist shade area during the plurality of exposure shots.

Next, a photo-development process is carried out on the photosensitive film (resist film) 115 on the main surface of the wafer 114 that was exposed as described above to form a pattern corresponding to the fine circuit pattern 103 in a dielectric film or metal film (for simplicity, this film, which is the film being processed, is not shown in the drawing) on the main surface of the wafer.

After that, the photosensitive film (resist film) 115 that was photo-developed is used as an etching mask to selectively etch the dielectric film or metal film thereunder, forming a dielectric film or metal film with a fine pattern corresponding to the fine pattern 103 on the main surface of the wafer 114.

Techniques used in conventional methods of manufacturing semiconductor integrated circuit devices are then employed to create a plurality of electronic devices having fine patterns forming electrodes and wiring in adjacent positions on a single wafer as shown in FIG. 9, and the individual electronic devices can be obtained as required by dicing them at the scribe area 33.

Figure 2A:
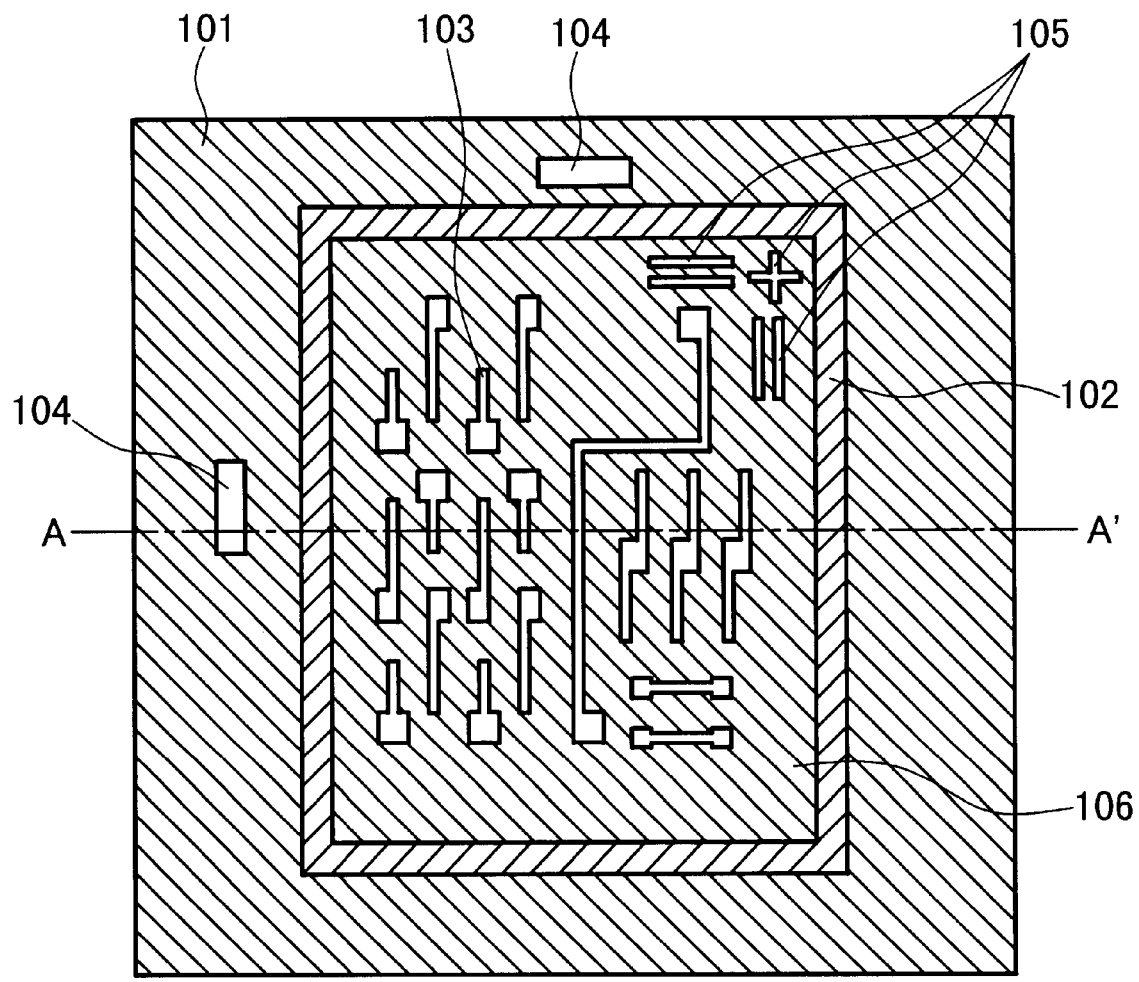
FIG. 2A is a plan view plan view showing the construction of a photomask used in a method of manufacturing a semiconductor integrated circuit device according to the invention.
Figure 2B:
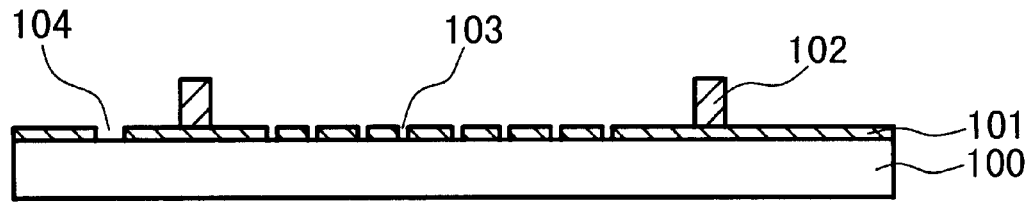
FIG. 2B is a sectional view.

Next, a concrete example of a mask used in this method of manufacturing semiconductor integrated circuit devices will be shown in FIG. 2A and FIG. 2B, FIG. 2A being a plan view of the mask, and FIG. 2B being a sectional view along the A–A' line in FIG. 2A.

Reference numeral 106 indicates a fine circuit pattern formation area that is made of the halftone film 101; the circuit pattern formation area (that is, the transferred area) 106 is surrounded by the shade area 102, which forms an outer band (or frame) of resist film. In FIG. 2A and FIG. 2B, reference numeral 103 indicates a narrow or rectangular circuit pattern to be transferred, reference numeral 104 indicates a reticle alignment mark formed in the halftone film 101 external to the circuit pattern formation area 106, reference numeral 105 indicates wafer alignment marks in the halftone film 101 within the circuit pattern formation area 106, and reference numeral 100 indicates an optically transmissive plate made of quartz glass. Note that the pattern side is depicted upward when the process of manufacturing the mask is being considered, but the mask is turned upside down with the pattern downward as shown in FIG. 1 when the mask is inserted into an aligner.

The resist film 102, in which a fine pattern is formed by photo-development, comprises an organic material, allowing the film and pattern to be formed without damaging the halftone film 101. As a result, controllability of phase and transmittance and accuracy of circuit pattern formation on the mask can be improved.

As shown in FIGS. 2A and 2B, the resist film 102 is a band in the shape of a rectangular or round frame, which completely surrounds the circuit pattern formation area (transferred area) 106, and the parts of the resist film at the edge of the mask plate that might touch an aligner stage or transportation system are removed. Although the resist shade area 102 is preferably rectangular or round in form, it can also be formed in an L or C shape if necessary, provided parts of the resist film 102 that might come into contact with the aligner stage and transportation system are removed, because, if the resist film 102 comes into contact with the stage (the support table, in particular) or the transportation system, the contacted part of the resist film may become detached, causing foreign matter defects.

Figure 4A:
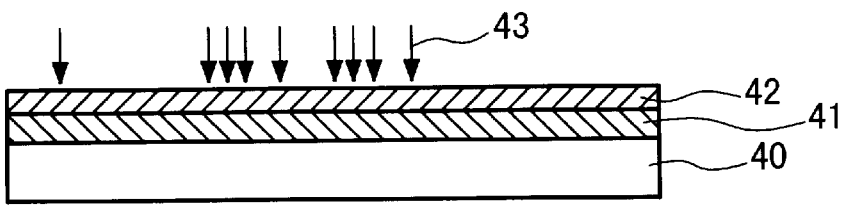
FIG. 4A to FIG. 4F are sectional views of steps for describing the method of manufacturing a photomask used in a method of manufacturing a semiconductor integrated circuit device according to the invention.

A process for manufacturing the halftone phase-shift mask shown in FIGS. 2A and 2B will now be described with reference to FIG. 4A to FIG. 4F which are partial sectional views of steps in the manufacturing process. First, as shown in FIG. 4A, a halftone film 41 is formed on a quartz glass optically transmissive plate 40, a photosensitive film (resist film) 42 is formed, and a pattern exposure 43 is carried out for gate electrode and wiring patterns. To produce a halftone effect, the film thickness d of the halftone film is set to $\lambda/\{2\cdot(n-1)\}$, where the wavelength of the exposure light is $\lambda$, and the refractive index of the halftone film 41 at the exposure wavelength is n. The transmittance with respect to the exposure light is set to 6%.

Here, an $SiN_xO_y$ film is used as the halftone film material. A $ZrSiO_x$, film, a $CrF_x$film, a $CrFO_x$ film, an $MoSi_x$ film, or a double-layer film of $ZrSiO_x$ and $ZrSiO_y$ can also be used here, where, X and Y indicate composition ratios.

Figure 4B:
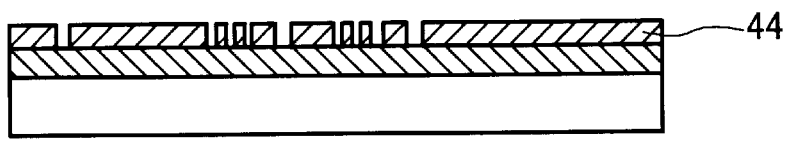
Figure 4C:

Next, as shown in FIG. 4B, photo-development is carried out to pattern the resist film 42 (44), and, as shown in FIG. 4C, the patterned resist film 44 is used as a mask to selectively etch the halftone film 41 to form a halftone film pattern 45.

Figure 4D:
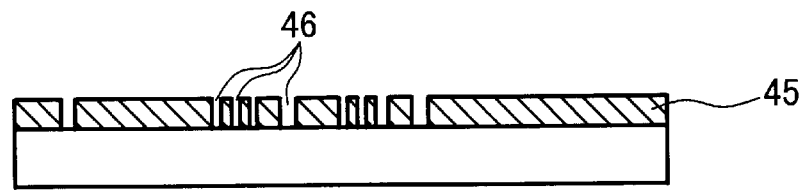
Figure 4E:
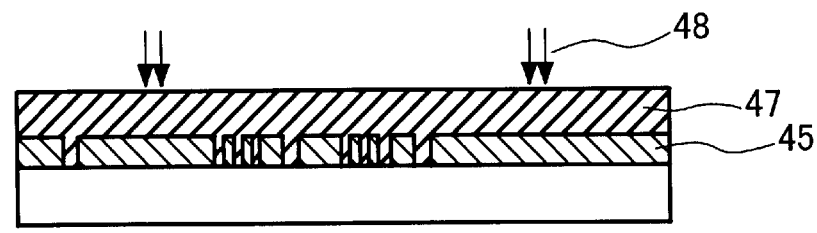
Figure 4F:
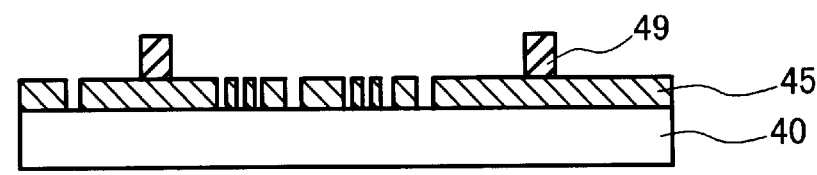

As shown in FIG. 4D, the resist film 44 is then removed to leave a halftone film 45 in which a circuit pattern 46 of desired gate electrodes and wiring is formed. After that, as shown in FIG. 4E, the region in which the shade area is to be formed is coated with negative resist and exposed (48). The area that might touch an aligner stage or transportation system is not exposed at the time of exposure of the photosensitive film on a semiconductor wafer as described above. When the exposure is carried out, the basic requirement is that a resist shade area 49 should extend far enough outward from the boundary of the area to be transferred to be adequately covered by the masking blade of an aligner.

It is preferable that the film thickness of the resist film 49 may be chosen to yield transmittance with respect to the exposure light of 0.3% or less, together with the halftone film 45 thereunder.

In consideration of repetitive exposure of the corner parts of the rectangular frame-like resist shade area 102 by step-and-repeat in the x and y directions at the time of exposure of the photosensitive film on the semiconductor wafer, if the number of overlapping exposures of the same place is four or less, the film thickness of the resist shade area 102 (or 49), together with the halftone film 45 thereunder, preferably yields a transmittance with respect to the exposure light of 1% or less.

Figure 7A:
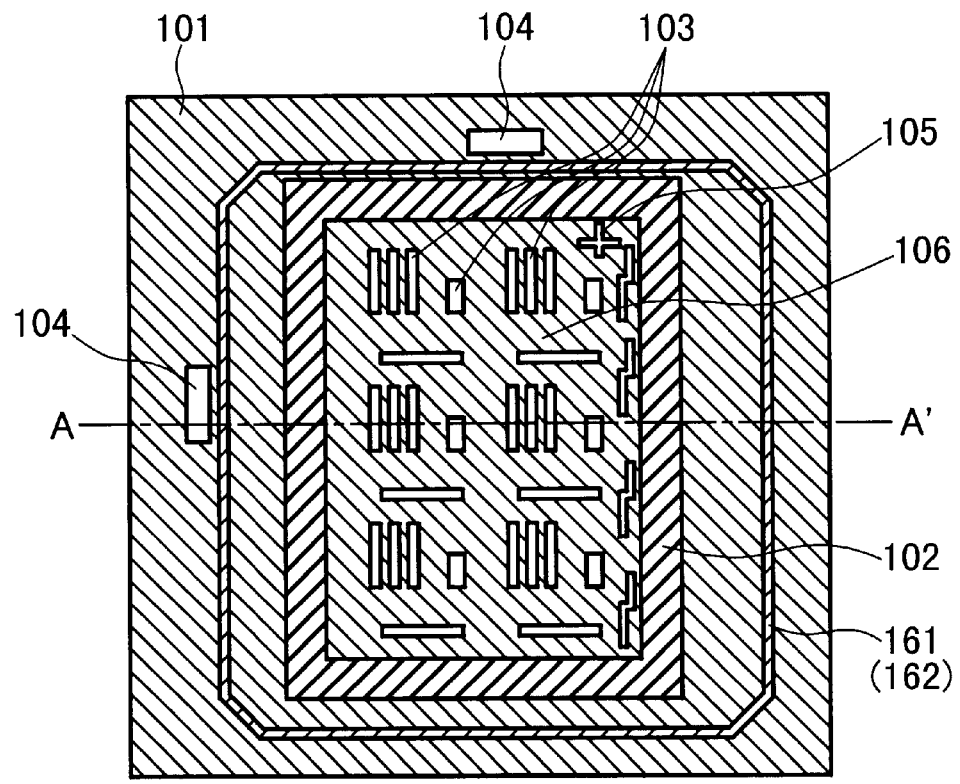
FIG. 7A is a plan view for describing the construction of another photomask used in a method of manufacturing a semiconductor integrated circuit device according to the invention.

After the mask has been formed in this way, a transparent thin-film pellicle is placed on its main surface to prevent particles from attaching to the pattern formation area thereof. An example will be described with reference to FIGS. 7A and 7B. FIG. 7A is a plan view of a halftone mask having a resist shade area similar to the one shown in FIGS. 2A and 2B, and FIG. 7B is a sectional view of the mask along the A–A' line when it is mounted on the supporting table.

Figure 7B:
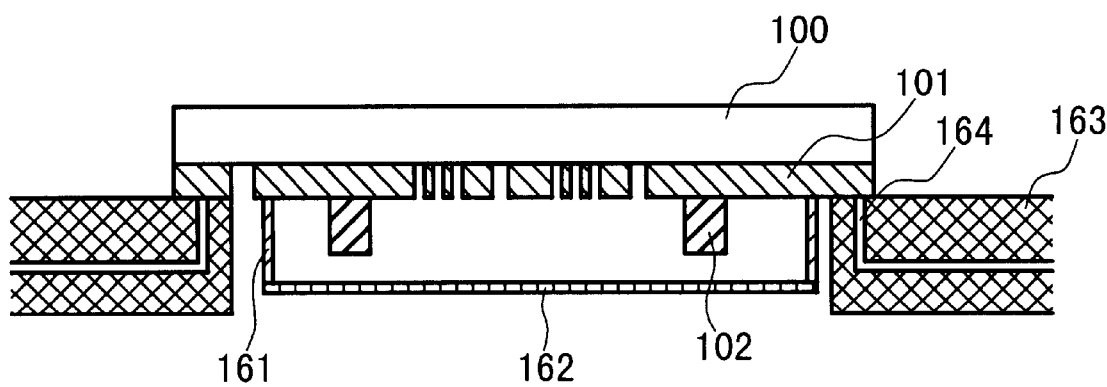
FIG. 7B is a sectional view.

The mask shown in FIGS. 7A and 7B, which has a pattern for a layer on a different level from that of the pattern shown in FIGS. 2A and 2B, differs significantly in that its surface is covered with a pellicle 161 (162). Except for this point, the mask is the same as that shown in FIGS. 2A and 2B, so the common functional parts and constituent parts are assigned with the same reference numerals.

In FIGS. 7A and 7B, a pellicle 162 is placed on the main surface (the first main surface) of the mask and fixed by a pellicle mount frame 161 to protect the surface. The area covered by the pellicle 162 is referred to as the pellicle covering area. The pellicle 162 is placed in such away that it covers and surrounds the whole of the chip field 106 and resist shade film 102 and partially overlaps the halftone film 101 on the pellicle covering area outside the integrated circuit pattern area. The base parts of the pellicle mount frame 161 are bonded and fixed in direct contact with the halftone film 101 inside the internal edges of the mask, inside the area in which an optical pattern is formed but external to the area covered by the pellicle. This arrangement can prevent the pellicle mount frame 161 from coming off while the mask is being transported or mounted on aligner or testing equipment. In addition, if the resist film 102 were to be formed at the attachment position of the pellicle mount frame 161, particles of resist film might come off when the pellicle 161 (162) is attached or detached. In this example, since the pellicle mount frame 161 is bonded in direct contact with the halftone film 101, the generation of such particles can be prevented. This effect can also be obtained by bonding and fixing the pellicle mount frame 161 in direct contact with the maskplate 100. Furthermore, as shown in FIG. 7B, the resist film 102 constituting the shade area is not present or formed at the surface part 164 of the mask which may make contact with the mounting part (supporting part) 163 of an aligner 102 constituting a shade area. This prevents the generation of particles due to peeling or abrasion of the resist film 102.

The structure described above produces the following effects.

(1) Providing a mask with a pellicle makes it possible to prevent the deposition of particles on the mask and avoid the consequent deterioration of the transferred pattern.

(2) Bonding the pellicle mount frame in direct contact with the shade pattern or the mask plate makes it possible to prevent peeling or abrasion of the shade pattern resist film when the pellicle is attached or detached. Therefore, the generation of particles caused by peeling and abrasion of the resist film can be prevented.

As shown in FIG. 7A, a reticle alignment mark 104 is provided in the halftone film 101 outside the pellicle 161 (162), and a wafer alignment mark 105 is provided in the halftone film 101 in the pattern formation area 106 within the pellicle 161 (162); therefore, as in FIGS. 2A and 2B, a plurality of masks can be aligned to the predetermined positions with improved accuracy.

Figure 8:
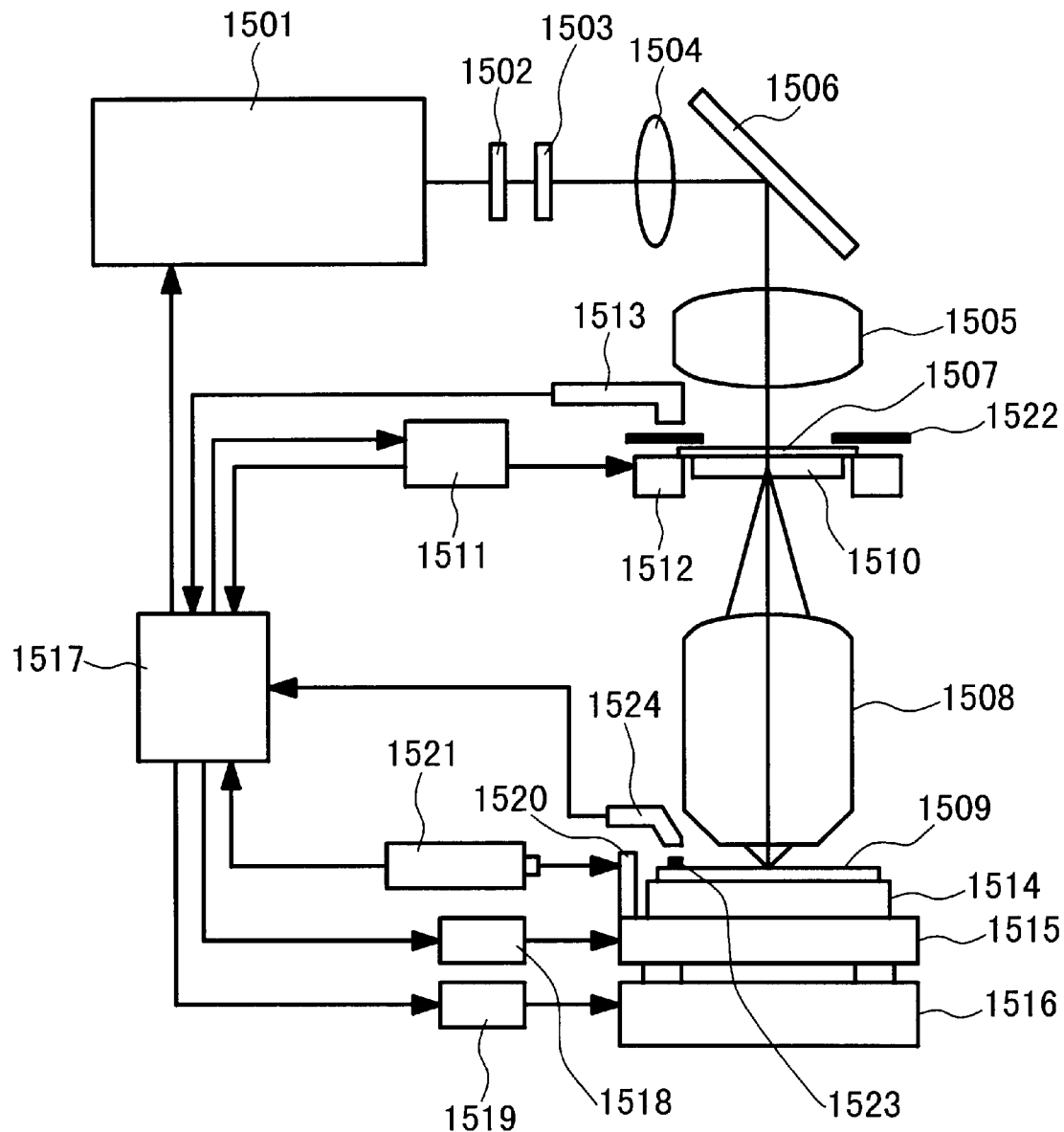
FIG. 8 is a conceptual drawing of the main part of an aligner, showing an overview of the aligner used in the method of manufacturing a semiconductor integrated circuit device according to the invention.

Next, a diagrammatic sketch of a reduction projection aligner will be shown in FIG. 8. Exposure light emitted from alight source 1501 in the reduction projection aligner is directed through a fly-eye lens 1502, a beam shape adjustment aperture 1503, condenser lenses 1504 and 1505, and a mirror 1506 onto a mask 1507. A masking blade 1522 is placed on the mask, by which the size of the aperture can be adjusted depending on the size of exposure area. The mask 1507 is mounted with its main surface (the first surface), on which the shade (halftone) pattern has been formed, facing down (facing a semiconductor wafer 1509). Therefore, the exposure light is incident on the back surface (the second main surface) of the mask 1507. The mask pattern formed on the mask 1507 is projected through a projection lens 1508 onto the plate to be exposed, i.e., the semiconductor wafer 1509. A pellicle 1510 is provided on the first main surface of the mask 1507 to prevent pattern transfer defects due to the deposition of foreign particles. The mask 1507 is held by suction on a mask stage 1512 controlled by a mask position control means 1511, and the position is measured by detecting reticle alignment marks on the mask 1507 with a position detection means 1513, whereby alignment of the center and the optic axis of the projection lens 1508 is performed accurately. The semiconductor wafer 1509 is held by suction on a specimen table 1514. The specimen table 1514 is mounted on a Z stage 1515 that can be shifted in the optic axis direction of the projection lens 1508, or in the z axis direction, and is also mounted on an X-Y stage 1516. The Z stage 1515 and the X-Y stage 1516 are driven by respective driving means 1518 and 1519 in response to control commands from a servo system 1517, so they can be moved to desired exposure positions. The position is accurately monitored as the position of a mirror 1520 with a laser distance meter 1521. A wafer alignment mark 1523 that has been formed on the wafer is detected by a wafer mark detection system 1524, and the position information is sent to the servo system 1517 for alignment.

As described above, the resist film forming the shade area is removed completely for the area on the mask that may come into contact with the aligners or transportation means, to prevent generation of particles when the mask is mounted on the aligner and transported. When this removal process was omitted, particles were generated, causing transfer defects.

Figure 3A:
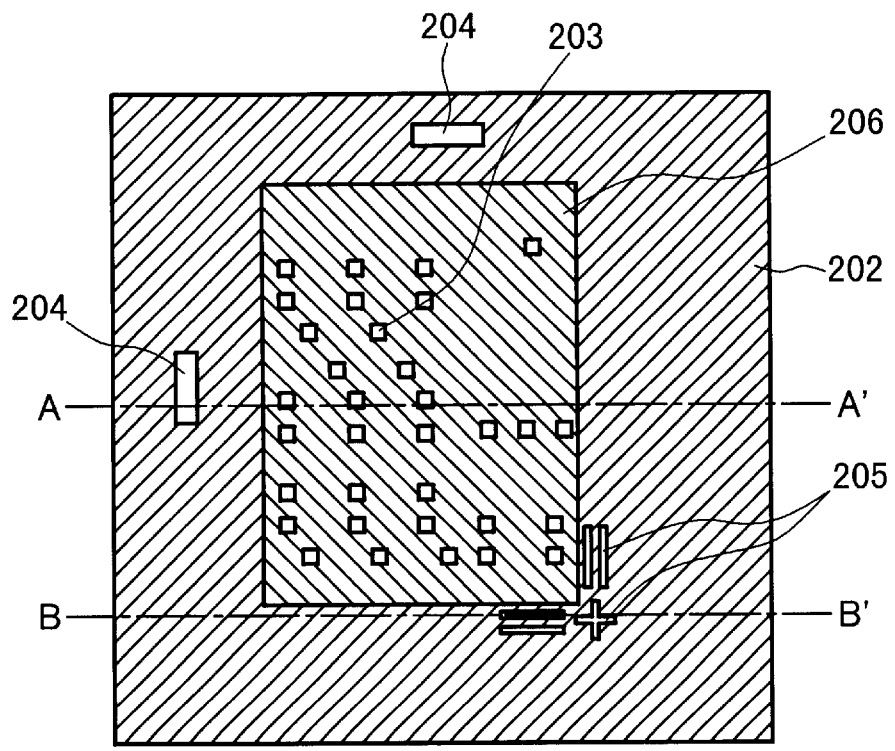
FIG. 3A is a plan view showing the construction of a photomask used in another method of manufacturing a semiconductor integrated circuit device according to the invention.
Figure 3B:
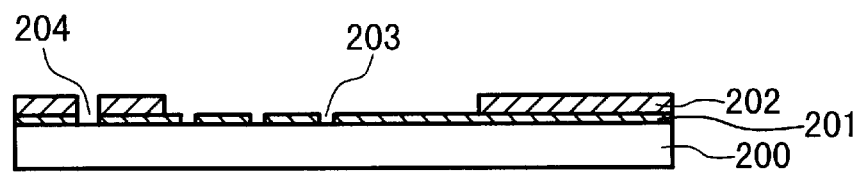
FIG. 3B and FIG. 3C are sectional views.
Figure 3C:
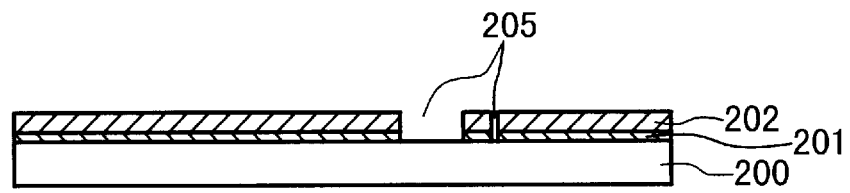

Next, in order to make the characteristics of the masks shown in FIGS. 2 and 7 more readily understandable, an example of a mask used in the method of manufacturing a semiconductor integrated circuit device according to the second aspect of the present invention to form fine holes in a dielectric film on the main surface of a wafer to attach electrode terminals extending to the semiconductor area in the wafer, or to form interconnections between wiring layers, will be shown in FIGS. 3A, 3B, and 3C. FIG. 3A shows a plan view of a mask, and FIGS. 3B and 3C show sectional views along the lines A–A' and B–B' line in FIG. 3A, respectively.

In a mask for forming a fine hole pattern with dimensions that are not expanded two-dimensionally (that is, in the x and y directions), the wafer alignment marks, indicated with reference numeral 205 in FIG. 3A, for aligning different exposure layers, are made of a metal such as chromium (Cr). In the figure, reference numeral 200 indicates an optically transmissive plate made of quartz glass, reference numeral 201 indicates a halftone film, reference numeral 202 indicates a metal shade film made of chromium(Cr) or another metal, reference numeral 203 indicates a hole pattern, reference numeral 204 indicates a reticle alignment mark, and reference numeral 206 indicates a hole pattern formation area (transfer area) made of a halftone film. The metal shade film 202 made of chromium (Cr) provided over the whole area outside the hole pattern formation area 206 prevents overlapping exposure during a plurality of exposure shots. As can be understood from the figure, the reticle alignment mark 204 is partially formed in the metal shade film 202 made of chromium (Cr) provided over the whole area outside the hole pattern formation area 206 as in the case of a wafer alignment mark 205.

Furthermore, in order to make it easier to understand the method shown in FIGS. 4A to 4F, utilizing a halftone phase-shift mask with a resist shade area as shown in FIGS. 2A and 2B, a method of manufacturing a halftone phase-shift mask utilizing the chromium shade area in FIGS. 3A, 3B, and 3C will briefly be described with reference to FIGS. 5A to 5H are partial sectional views of steps in the manufacturing process.

Figure 5A:
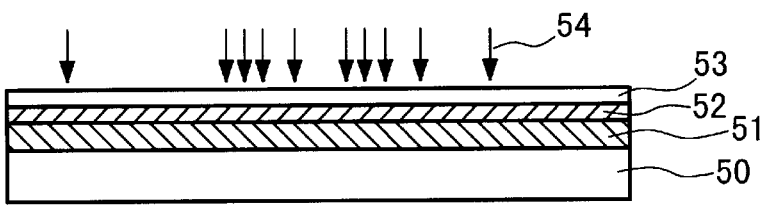
FIG. 5A to FIG. 5H are sectional views of steps for describing a method of manufacturing a photomask used in another method of manufacturing a semiconductor integrated circuit device according to the invention.
Figure 5B:
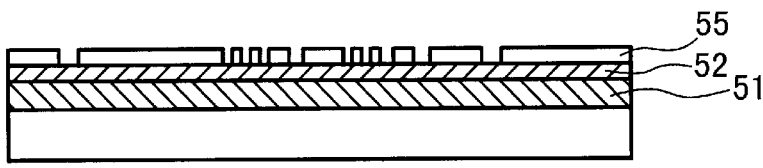
Figure 5C:
Figure 5D:
Figure 5E:
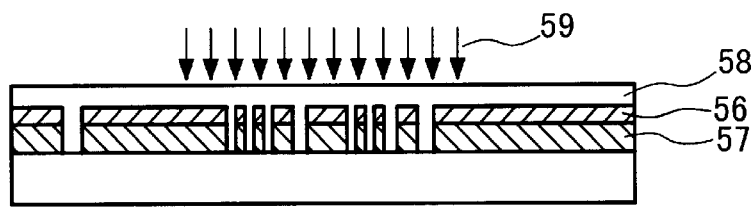
Figure 5F:
Figure 5G:
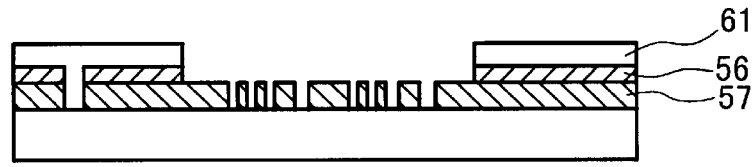
Figure 5H:
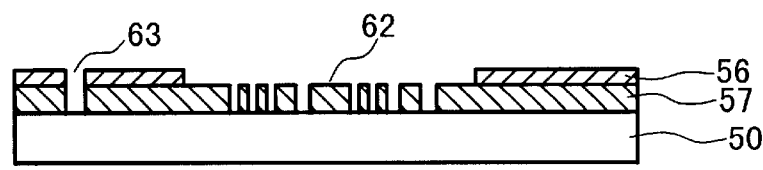

First, as shown in FIG. 5A, a halftone film 51, a Cr film 52, and a resist film 53 are sequentially deposited onto quartz glass 50, and a desired pattern is exposed (54). Photo-development is performed to form a resist film pattern 55 as shown in FIG. 5B. Next, as shown in FIG. 5C, the Cr film and the halftone film are etched sequentially to form a pattern 56 in the Cr film and halftone film. The resist film residue is removed as shown in FIG. 5D; then a resist film 58 is deposited again as shown in FIG. 5E. Photo-development is performed to form a resist film pattern 60 as shown in FIG. 5F, which is etched to form a Cr film pattern 61 by removing the chromium from locations not masked with the resist film, as shown in FIG. 5G. Finally, the resist film residue is removed to form a halftone phase-shift mask comprising a shade area 63 made of Cr and a halftone area 62 as shown in FIG. 5H.

The mask forming method shown in FIGS. 5A to 5H has problems in that: (1) controllability of phase and dimensional accuracy of patterns is reduced because the halftone film is non-uniformly etched when the capping Cr film is removed; and (2) a halftone material having adequate etching selectivity with respect to Cr but capable of being etched with high dimensional accuracy when overlain by Cr must be selected, so the range of material selection of material selection of alternatives is limited, making accuracy difficult to attain.

This limitation of the range of alternatives becomes a significant problem in a mask for an ArF excimer laser (having a wavelength of 193 nanometers) or an F2 excimer laser (having a wavelength of 157 nanometers) that emits highly energetic exposure light and makes exposure light irradiation resistance a particularly important issue, so a halftone mask using the resist shade area shown in FIGS. 2A and 2B and FIGS. 4A to 4F is more desirable, especially for forming narrow fine patterns (improving controllability of phase by 4% to 3% compared to the mask shown in FIGS. 3A to 3C and FIGS. 5A to 5H, and also improving dimensional accuracy by 2%), but, as a mask for forming a fine hole pattern, it is preferable to use the mask shown in FIGS. 3A to 3C and FIGS. 5A to 5H as will be described in detail in the second embodiment.

Second Embodiment

A method of manufacturing a semiconductor integrated circuit device having a twin-well complementary MIS (CMIS) circuit using the present invention will now be described with reference to FIGS. 6A to 6D, which are partial sectional views of steps in the manufacturing process.

Figure 6A:
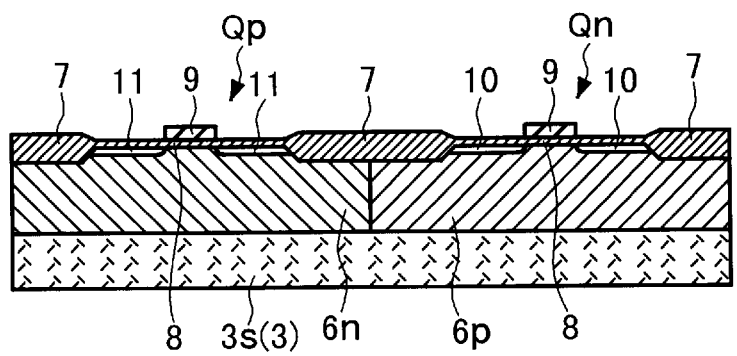
FIG. 6A to FIG. 6D are sectional views of steps for describing a method of manufacturing a semiconductor integrated circuit device according to the invention.

FIG. 6A is a sectional view of part of a semiconductor wafer 3 used in the manufacture process. The semiconductor wafer 3 comprises a thin, round plate of silicon or another semiconductor material. The semiconductor substrate 3s in the semiconductor wafer 3 comprises, for example, n-type mono-crystalline silicon on which an n-type semiconductor region (well) 6n and p-type semiconductor region (well) 6p are formed. The n-type well 6n contains an n-type impurity such as phosphorus (P) or arsenic (As). The p-type well 6p contains a p-type impurity such as boron (B).

On the main surface (the first surface), a field dielectric film 7 for isolation, made of a silicon oxide film or the like, is formed by local oxidization of silicon (LOCOS) or another method. This isolation area can be of the trench type. That is, the isolation area can also be formed by filling a dielectric film into a groove that has been excavated into the thickness of the semiconductor substrate 3s.

An n-type MISFET Qn and a p-type MISFET Qp are formed in respective semiconductor active regions surrounded by the field dielectric film 7. The gate dielectric film 8 of the n-type MISFET and p-type MISFET is an oxide film formed by, for example, thermal oxidation of silicon.

The narrow gate electrode 9 of each of these n-type and p-type MISFETs is formed as follows: a gate formation film made of low-resistance polysilicon is deposited by a chemical vapor deposition (CVD) method; then a photosensitive film (resist film) is deposited onto the whole surface of the film; the photosensitive film is exposed by using the ArF excimer laser reduction projection aligner shown in FIG. 8 and a halftone phase-shift mask having the resist shade area that was described with reference to FIGS. 2A and 2B or FIGS. 7A and 7B with an oblique illumination system as shown in FIG. 1; the exposed photosensitive film is photo-developed to transfer a mask pattern corresponding to the gate electrodes thereonto; and a conventional etching process is performed to pattern the low-resistance polysilicon film. The gate length is, for example, on the order of 0.1 $\mu$m (micrometer), but is not specifically limited to the value.

The oblique illumination system is effective not only in the controllability of gate pattern dimensions but also in the accuracy of the shapes and positions of reference alignment marks that are formed at the same time as the gate pattern. It has become clear that an alignment mark having a wider line width than that of the gate pattern is affected by lens aberration, and the accuracy of its shape and position is reduced, when a halftone film is used. This problem is solved by using an oblique illumination system; thus the alignment accuracy of a contact hole layer that is aligned with the gate layer, for example, is improved.

A semiconductor region 10 that constitutes the source and drain of the n-type MISFET Qn in FIG. 6A is formed in a self-aligned manner with the gate electrode 9 by introducing an impurity such as phosphorus (P) or arsenic (As) into the p-type semiconductor region 6p through an ion-implantation process using the gate electrode 9 as a mask. A semiconductor region 11 that constitutes the source and drain of the p-type MISFET Qp is formed in a self-aligned manner with the gate electrode 9 by introducing an impurity such as boron (B) into the n-type semiconductor region 6n through an ion-implantation process using the gate electrode 9 as a mask. Note that the gate electrode 9 is not limited to a structure of a single low-resistance polysilicon film but can have various modified structures: it can have a so-called polycide structure that is formed by adding a silicide layer such as a layer of tungsten silicide or cobalt silicide to the low-resistance polysilicon film, or it can have a so-called poly-metal structure that is formed by adding a metal film such as a tungsten film, which is joined to the low-resistance polysilicon film through a barrier conduct or film made of titanium nitride, tungsten nitride, or another suitable material.

Figure 6B:
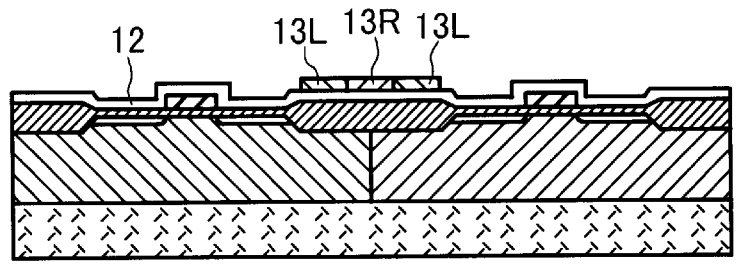

Next, after an inter-layer dielectric film 12 such as a silicon oxide film, for example, is deposited on the semiconductor substrate 3s by CVD or another method, a polysilicon film 13 is deposited on the upper surface by CVD or another method. Then the polysilicon film 13 is patterned by photolithography technology, using the KrF excimer laser reduction projection aligner shown in FIG. 8 and a halftone phase-shift mask having a resist shade area as shown in FIGS. 2A to 2B and 7A to 7B, and by conventional etching technology, and an impurity is introduced into predetermined areas in the patterned polysilicon film to form wiring 13L and a resistor 13R (FIG. 6B).

Figure 6C:
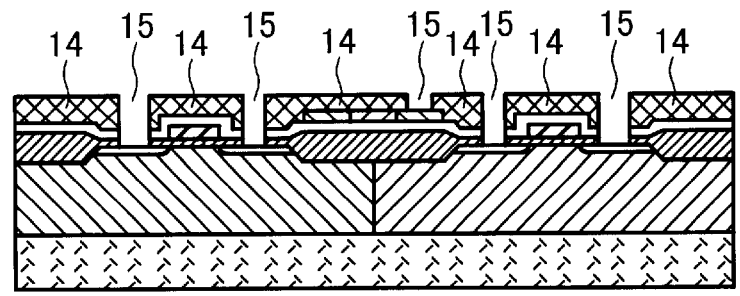

After that, as shown in FIG. 6C, a TEOS film 14, for example, comprising a silicon oxide film is deposited on the semiconductor substrate 3s, then a fine contact hole 15 is formed by photolithography technology, using the ArF excimer laser reduction projection aligner shown in FIG. 8 and a halftone phase-shift mask having a metal shade area as shown in FIGS. 3A to 3C, and by conventional etching technology in such a way that a part of the semiconductor region 10 or 11 or the wiring 13L is exposed through the inter-layer dielectric film 12 and the TEOS film 14.

The reason why this hole patterning process uses the mask shown in FIGS. 3A to 3C instead of the mask shown in FIGS. 2A and 2B or FIGS. 7A and 7B will now be described.

In the exposure of a fine hole pattern, the exposure light diffracts and expands in both the x and y directions, reducing the effective pattern exposure strength of the projected image. A method of forming a pattern of holes of a predetermined size on a wafer by exposing the pattern with an increased amount of exposure light has therefore been suggested. However, when a wafer alignment mark with dimensions larger than the hole pattern and with less of a two-dimensional diffraction effect is exposed with this relatively large amount of exposure light, the mark is overexposed. For example, the typical size of a hole pattern is 1.0 $\mu$m to 1.5 $\mu$m (micrometer) on the mask but the line width of an alignment mark is 15 $\mu$m, so if a mask with a wafer alignment mark surrounded by a halftone film as shown in FIGS. 2A and 2B is used, the amount of exposure light that passes through the halftone part expands too much, and interference occurs between the expanded light and diffracted light in the pattern part, altering the geometry of the transferred alignment mark. Therefore, the alignment accuracy between the layer including the hole pattern and the layer to be aligned with it is reduced, causing faulty alignment.

On the other hand, in the case of the mask shown in FIGS. 3A to 3C, since the wafer alignment mark is surrounded by a sufficiently shaded area made of Cr, even if the exposure light is excessive, the geometry of the transferred alignment mark becomes highly symmetric, so higher alignment accuracy can be obtained.

Although this embodiment uses a halftone mask having a Cr shade area as shown in FIGS. 3A to 3C for exposing holes, a binary mask can also be used to obtain sufficient alignment accuracy if it employs a film made of an adequately light-proof material, such as Cr. The halftone mask shown in FIGS. 3A to 3C is more preferable for holes with higher resolution, however.

For effective performance of the fine pattern exposure and alignment operations in various processes, it is preferable if the expensive aligner can be used in common for these processes, without large alterations of the exposure conditions depending on the process. For this reason, the halftone mask shown in FIGS. 3A to 3C, in which a fine circuit pattern is constructed with a halftone film as shown in FIGS. 2A and 2B and the surrounding area is covered with a metal shade, is preferably used in this hole-formation process. The metal of the metal shade area is not limited to Cr; metals such as tungsten (W), titanium (Ti), and tantalum (Ta), or metal compounds such as tungsten nitride (WN) and titanium tungstate (TiW) can also be used.

As described above, in the mask shown in FIGS. 3A to 3C, the Cr frame 202 includes a reticle alignment mark 204 and a wafer alignment mark 205, and these marks are used to transfer a plurality of fine hole patterns to a wafer with improved alignment accuracy.

Figure 6D:
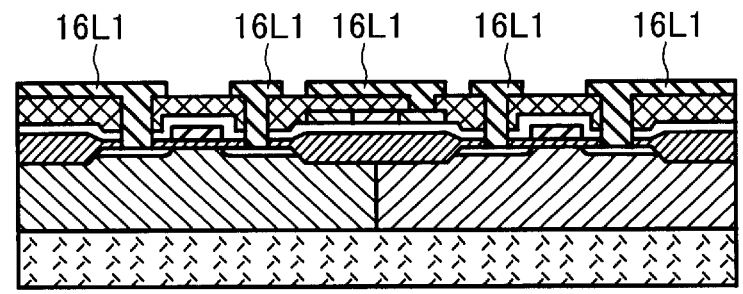

We return now to the description of the CMIS fabrication process. After a metal film made of tungsten or other metal is deposited on the semiconductor substrate 3s that has been obtained in FIG. 6C by CVD or another method, the metal film is patterned with photolithography technology, using the ArF excimer laser reduction projection aligner shown in FIG. 8 and a halftone phase-shift mask having a resist shade area as shown in FIGS. 2A and 2B and FIGS. 7A and 7B, and conventional etching technology to form a first layer wiring 16L1 as shown in FIG. 6D.

After this, second and subsequent layers of wiring (not shown in the drawing) are formed in the same way, above the first layer of wiring to fabricate the semiconductor integrated circuit device.

CMIS devices fabricated according to this method showed a 4% improvement in dimensional accuracy in lithography transfer and caused no faulty alignment. Therefore, yields in the production of high-speed LSI chips increased by 5%.

As can be understood from this embodiment, it is preferable that the manufacture of semiconductor integrated circuit devices uses a first halftone phase-shift mask with a metal shade film, or the binary mask, for forming fine-dimensioned hole patterns having little two-dimensional expansions, and a second halftone phase-shift mask with a resist shade area as shown in FIGS. 2A and 2B and FIGS. 7A and 7B for forming electrode and wiring patterns with both narrow and wide dimensions, which are more expanded in the x or y direction than the hole pattern. It is also preferable to form mask alignment marks in the metal shade film on the first mask and in the halftone film surrounded by the resist shade area on the second mask, and use them to align the respective masks with predetermined positions on the wafer accurately.

Third Embodiment

Next, as a third embodiment, a method of manufacturing a semiconductor memory device will be described with reference to FIGS. 10A to 10D and FIGS. 11A and 11B. FIGS. 10A to 10D partial sectional views of steps in the manufacturing process of the device, and in FIGS. 11A and 11B are plan views of part of the manufactured device.

Figure 10A:
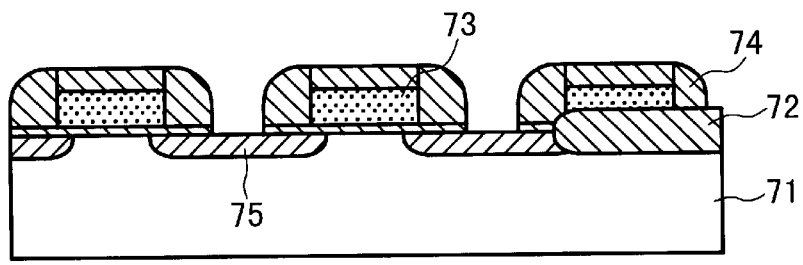
FIG. 10A to FIG. 10D are partial sectional views of a semiconductor wafer at different steps for describing another method of manufacturing a semiconductor integrated circuit device according to the invention.
Figure 11A:
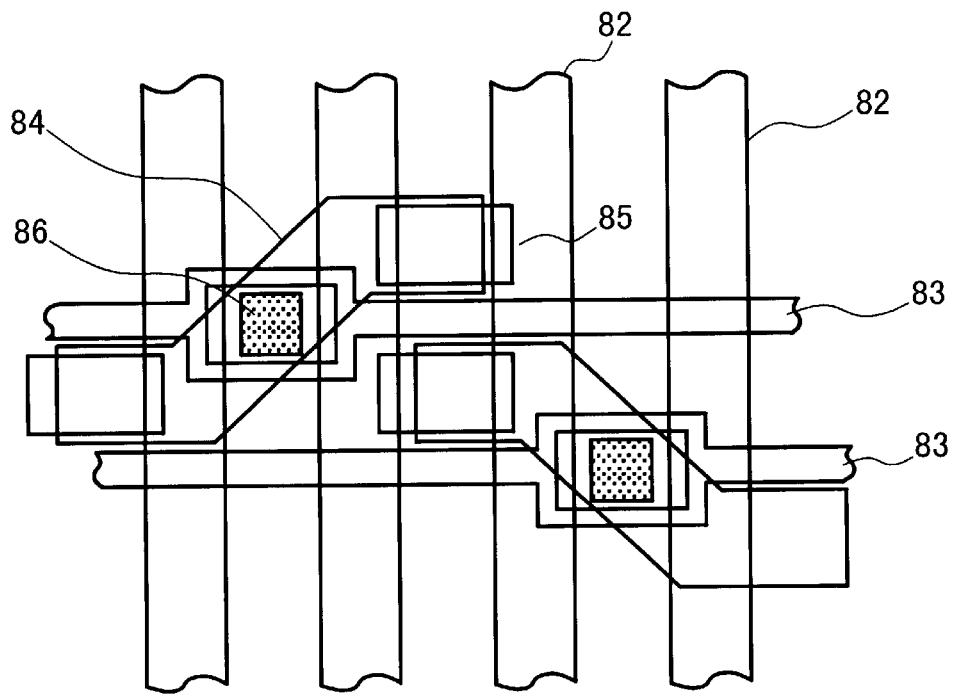
FIG. 11A to FIG. 11B are plan views of pattern parts for describing a semiconductor integrated circuit device manufactured according to the present invention.
Figure 11B:
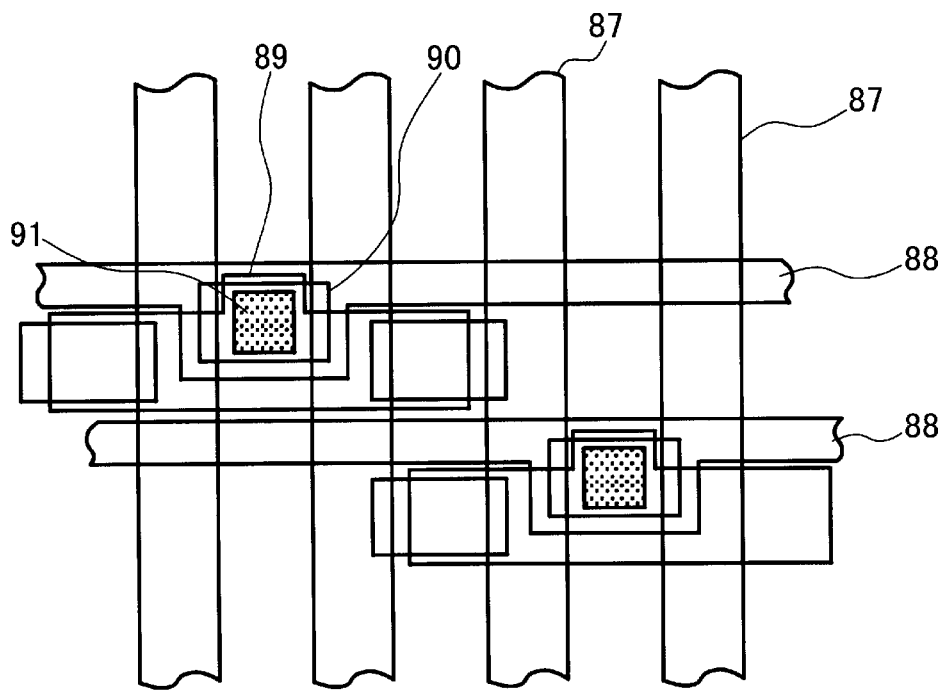

As shown in FIG. 10A, a p-type Si semiconductor region 71 is used as the substrate (wafer), on the surface of which a device isolation area 72 is formed using conventional device isolation technology. Next, a word line 73, with a structure formed by deposition of a poly-crystalline Si layer (gate electrode) with a thickness of 150 nm (nanometers) and a $SiO_2$ film(gate dielectric film)with a thickness of 200 nm (nanometers), for example, is formed; then a $SiO_2$ film with a thickness of 150 nm (nanometers) is deposited thereon by chemical vapor deposition (CVD) and anisotropically processed to form a side spacer 74 comprising a $SiO_2$ film on the wall sides of the word line 73. Next, an n-type diffusion layer 75 (source and drain region) is formed.

Figure 10B:
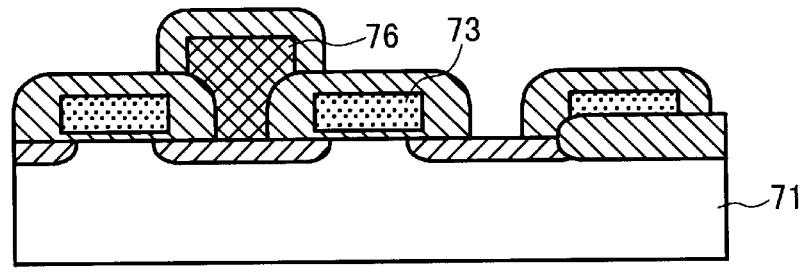

Next, as shown in FIG. 10B, a data line 76 comprising poly-crystalline Si or high melting point metal silicide or a laminated film thereof, is formed.

Figure 10C:
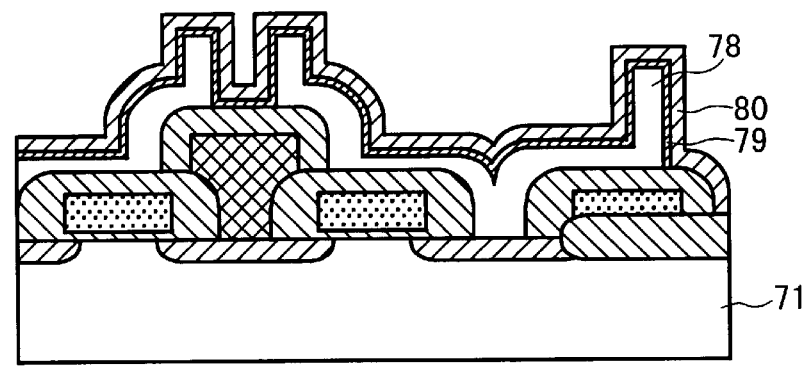

Next, a storage electrode (capacitor electrode) 78 is formed, on which a film of $Ta_2O_5$, $Si_3N_4$, $SiO_2$, BST, PZT, or a ferroelectric substance, or a compound film there of, is deposited to form a capacitor dielectric film 79. Further, poly-crystalline Si, a high melting point metal, a high melting point metal silicide, or a low-resistance conductor such as Al or Cu is deposited to form a plate electrode 80 (FIG. 10C).

Figure 10D:
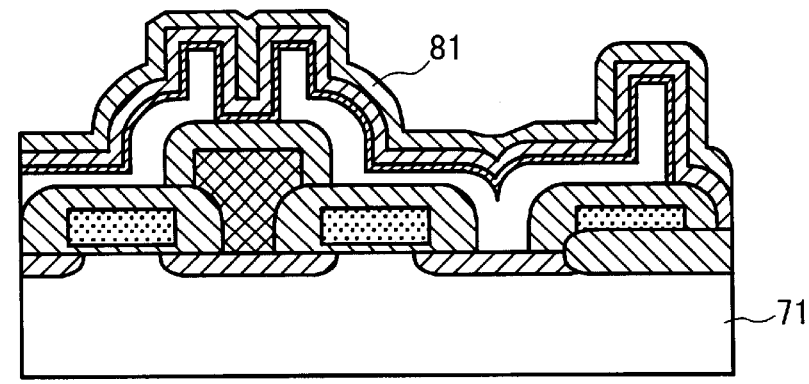

Next, as shown in FIG. 10D, the memory device is fabricated through a conventional interconnection process including formation of wiring and a dielectric film 81, and a passivation process.

A pattern formed through lithography according to the present invention will be described below. FIG. 11A is a plan view of the arrangement of a typical pattern in the memory part of a fabricated memory device. Reference numeral 82 indicates a word line, reference numeral 83 indicates a data line, reference numeral 84 indicates an active area, reference numeral 85 indicate a storage electrode, and reference numeral 86 indicates an electrode contact hole pattern.

FIG. 11B is a plan view of the arrangement of a typical pattern in the memory part of another fabricated memory device. Reference numeral 87 indicates a word line, reference numeral 88 indicates a data line reference numeral 89 indicates an active area, reference numeral 90 indicates a storage electrode, and reference numeral 91 indicates an electrode contact hole pattern.

The word lines 82 and 87 and the data lines 83 and 88 are formed by using a halftone phase-shift mask having a resist shade film as shown in FIGS. 2A and 2B and FIGS. 7A and 7B, which were also described in the first and second embodiments. In FIG. 11B, the storage electrode 90 is also patterned by using a halftone phase-shift mask.

If the pattern density, that is the ratio of light transmitted areas to the mask exposed area, exceeds about 25%, the optimum amount of exposure light of the circuit pattern is around a level that does not affect the geometrical symmetry of the transferred wafer alignment marks. A halftone phase-shift mask with a resist shade area has higher phase controllability and dimensional accuracy, as described above, thus a higher lithographic transfer accuracy. In addition, as shown in FIG. 1, exposing a halftone phase-shift mask having a resist shade area with light obliquely incident through the mask, in a so-called oblique illumination system, can prevent the exposure light strength from peaking, or sub-peaking, and improve the depth of focus.

On the other hand, formation of the electrode contact hole patterns 86 and 91 uses a halftone phase-shift mask with a Cr shade area as shown in FIGS. 3A, 3B, and 3C. The wafer alignment marks on this mask are formed in the Cr film. Exposure using this mask makes it possible to obtain higher alignment accuracy from the wafer alignment marks formed on the wafer, and achieves better symmetry in hole pattern formation.

Semiconductor memory devices manufactured by using the present invention have shown the following specific improvements in their characteristics: (1) faster and more stable read operation, due to reduced line width variation in word lines; and (2) more stable data retention characteristics, due to reduced variation in storage electrode area.

Although these descriptions have focused on the use of the present invention to manufacture a dynamic random access memory (DRAM) chip, the invention is not limited to this application; it can also be used to manufacture a semiconductor integrated circuit device having another type of memory circuit such as a static random access memory (SRAM) or a flash memory (or electrically erasable read-only memory (EEPROM)), a semiconductor integrated circuit device having a logic circuit such as a microprocessor, or a mixed type semiconductor integrated circuit device having both memory and logic circuits integrated on the same semiconductor substrate.

Although the examples in the various embodiments have mainly been of halftone phase-shift patterns formed in a halftone film with alignment marks provided in the halftone film to obtain better alignment accuracy, as shown in FIGS. 2A to 2C, FIG. 6, and FIGS. 11A and 11B in Japanese Patent Application No. 2000-128944 filed by the present inventor and others, a phase-shift pattern can also be created by forming projections and depressions on the surface of a transparent mask plate. When phase angles are adjusted by this method of forming relief in the plate, one method (1) is to form the shift pattern, form the plate relief, deposit an optically opaque element, and pattern the optically opaque element; another method (2) of adjusting the phase angles is to pattern an optically opaque element, then form self-aligned relief on the mask using the optically opaque element as a mask. The latter method, because it is self-aligned, presents no serious problems with alignment, so it is especially advantageous for complicated fine patterns.

Although the embodiments above have mainly described a method of manufacturing a semiconductor integrated circuit device by transferring various fine patterns onto a semiconductor wafer, the present invention is not limited to this application; it can also be applied to the manufacture of other electronic devices having extremely fine patterns, such as superconductive devices, and to the manufacture of micro machines.

In the invention, fine patterns can be formed with high dimensional accuracy and high alignment accuracy. Therefore, an electronic device of such as a semiconductor integrated circuit device having high operation speed or high integration density is manufactured with high reproducibility.

What is claimed is:

1. A method of manufacturing an electronic device, comprising:
   providing a halftone phase-shift mask having a halftone phase-shift pattern formation area including a circuit pattern with plurality of discrete circuit pattern components arranged on an optically transmissive plate, and a resist shade film disposed outside the pattern formation area and having portions arranged to embrace at least part of the pattern formation area; and
   obliquely illuminating the mask, thereby transferring the circuit patter to a photosensitive film provided on a surface of a workpiece.

2. A method of manufacturing an electronic device according to claim 1, wherein different adjacent areas in the photosensitive film provided on the surface of the workpiece are repeatedly exposed in such a way that a pattern of the resist film is transferred in a partially overlapping manner.

3. A method of manufacturing an electronic device, wherein a plurality of masks are used to form a hole pattern and a wiring pattern on a workpiece, said method comprising:
   conducting a first projection exposure process using a first halftone phase-shift mask having a first halftone phase-shift pattern formation area including a plurality of discrete pattern components corresponding to the hole pattern provided on a first optically transmissive plate, and a metal shade film provided on the surface of the first optically transmissive plate outside the first pattern formation area, thereby transferring the hole pattern to the workpiece; and
   conducting a second projection exposure process using a second halftone phase-shift mask having a second halftone phase-shift pattern formation area including a plurality of discrete pattern components corresponding to the wiring pattern provided on second optically transmissive plate, and a band-like resist shade film provided outside the second pattern formation area and having portions arranged to embrace at least art of the second pattern formation area, thereby transferring the wiring pattern to the workpiece.

4. A method of manufacturing an electronic device, wherein a plurality of masks are used to form a hole pattern and a wiring pattern on a workpiece, said method comprising:
   conducting a first projection exposure process using a binary mask comprising a shade part and an optically transmissive part provided on a first optically transmissive plate and having a plurality of discrete pattern components corresponding to the hole pattern, thereby transferring the hole pattern to the workpiece; and
   conducting a second projection exposure process using a halftone phase-shift mask having a halftone phase-shift pattern formation area, including a plurality of discrete pattern components corresponding to the wiring pattern, and a resist shade film provided outside the pattern formation area with portions arranged to embrace at least part of the pattern formation area on a second optically transmissive plate, thereby transferring the wiring pattern to the workpiece.

5. A method of manufacturing a semiconductor integrated circuit device, comprising:
   forming a fine hole pattern in each of a plurality of regions of a dielectric film provided on a semiconductor substrate having a corresponding plurality of semiconductor regions;
   said fine hole pattern forming step being conducted using a first halftone phase-shift mask to expose a first photosensitive film provided on the dielectric film, the first halftone phase-shift mask having a first halftone phase-shift pattern formation area including a plurality of discrete pattern components corresponding to the fine hole pattern arranged on surface of a first optically transmissive plate, and a metal shade film provided outside the first pattern formation area on the surface of the first optically transmissive plate; and
   forming a wiring pattern in each of a plurality of regions of a conductive layer provided on the semiconductor substrate in correspondence with said plurality of semiconductor regions;
   said wiring pattern forming step being conducted using a second halftone phase-shift mask to expose a second photosensitive film provided on the conductive layer, the second halftone phase-shift mask having a second halftone phase-shift pattern formation area including a plurality of discrete pattern components corresponding to the wiring pattern provided on a surface of a second optically transmissive plate, and a resist shade film provided outside the second pattern formation area on the surface of the second optically transmissive plate and having portions arranged to embrace at least part of the second pattern formation area.

6. The method of manufacturing a semiconductor integrated circuit device according to claim 5, wherein first mask alignment marks for the first halftone phase-shift mask are formed in the metal shade film, second mask alignment marks for the second halftone phase-shift mask are formed in the second pattern formation area, and the first and second alignment marks are used to align the two masks with the semiconductor substrate.

7. A method of manufacturing a semiconductor integrated circuit device, comprising:

forming a fine hole pattern in each of a plurality of regions of a dielectric film provided on a semiconductor substrate having a corresponding plurality of semiconductor regions;

said fine hole pattern forming step being conducted using a binary mask to expose a first photosensitive film provided on the dielectric film, the binary mask comprising a shade part and an optically transmissive part provided on a first optically transmissive plate and having a plurality of discrete pattern components corresponding to the hole pattern; and forming a wiring pattern in each of a plurality of regions of a conductive layer provided on the semiconductor substrate in correspondence with said plurality of semiconductor regions;

said wiring pattern forming step being conducted using a halftone phase-shift mask to expose a second photosensitive film provided on the conductive layer, the second halftone phase-shift mask having a halftone phase-shift pattern formation area including a plurality of discrete pattern components corresponding to the wiring pattern provided on a second optically transmissive plate, and a resist shade film provided outside the pattern formation area on the second optically transmissive plate and having portions arranged to embrace at least part of the pattern formation area.

8. The method of manufacturing a semiconductor integrated circuit device according to claim 7, wherein mask alignment marks for the halftone phase-shift mask are formed in a halftone film in the pattern formation area, and the alignment marks are used to align the halftone phase-shift mask with the semiconductor substrate.

9. A method of manufacturing an electronic device, comprising the steps of:

preparing a halftone phase-shift mask having a circuit pattern formation area formed on an optically transmissive plate with a halftone film pattern for dimming exposure light and shifting the phase of the exposure light, the circuit pattern formation area including a plurality of discrete circuit pattern components, and a resist shade film provided outside the circuit pattern formation area having portions arranged to embrace at least part of the circuit pattern formation area;

irradiating the circuit pattern formation area of the halftone phase-shift mask with light, and inspecting for presence or absence of resist residue on the mask by observing fluorescence; and using the inspected halftone phase-shift mask to expose a photosensitive film provided on a main surface of a workpiece and thereby transfer the circuit pattern to the photosensitive film.

10. A method of manufacturing an electronic device, comprising:

providing a photomask having a circuit pattern including a plurality of discrete circuit pattern components formed in a circuit pattern formation area on an optically transmissive plate, and a resist shade film provided in an area outside the pattern formation area and having portions arranged to embrace at least part of the circuit pattern formation area to filter out exposure light; and transferring the circuit pattern a plurality of times to different transfer locations on a photosensitive film provided on a main surface of a workpiece, by exposing the workpiece to obliquely incident light through the photomask in a stepped or scanned manner, such that transfer areas on the workpiece corresponding to the resist film partially overlap for different exposures.

11. A method of manufacturing an electronic device, comprising:

mounting a halftone phase-shift mask on a reduction projection aligner, the halftone phase-shift mask being formed on an optically transmissive plate and including a pattern formation area with a halftone phase-shift film in which a circuit pattern having a plurality of discrete circuit pattern components and mask alignment marks are formed, and a resist shade film provided outside the pattern formation area and having portions arranged to embrace at least part of the pattern formation area;

aligning the halftone phase-shift mask and a wafer with reference to the mask alignment marks formed in the halftone film; and exposing a photosensitive film provided on a main surface of the wafer to light obliquely incident through the halftone phase-shift mask.

12. A method of manufacturing an electronic device, comprising:

providing a half tone phase-shift mask having a halftone phase-shift pattern including a plurality of discrete circuit pattern components provided in a pattern formation area on an optically transmissive plate, and a resist shade film provided outside the pattern formation area and having portions arranged to embrace at least part of the pattern formation area;

mounting the half tone phase-shift mask on a projection aligner with the resist shade film being kept from touching a mask transportation and support system; and exposing the pattern a plurality of times, with light obliquely incident through the mask, onto different adjacent areas of a photosensitive film provided on a surface of a workpiece in such a way that transfer areas on the photosensitive film corresponding to the resist film are partially overlapping for different exposures.

13. A method of manufacturing an electronic circuit device, comprising:

performing lithography using (i) a first photomask with a resist shade film filtering out exposure light, the resist shade film being located outside a pattern formation area in which a circuit pattern having a plurality of discrete circuit pattern components is disposed and having portions arranged to embrace at least part of the pattern formation area, and (ii) a second photomask with a metal shade film filtering out exposure light and provided outside a pattern formation area of the second photomask.

14. A method of manufacturing an electronic circuit device, comprising:

performing lithography using a plurality of halftone phase-shift masks each having an exposure light transmitting area and an area in which the exposure light is dimmed and reversed in phase, wherein one of said masks is a halftone phase-shift mask with a resist shade film which filters out exposure light, the resist shade film being located outside a pattern formation area including a plurality of discrete circuit pattern components, and the resist shade film having portions arranged to embrace at least part of the pattern formation area, and wherein another of said masks is a photomask with a metal film which filters out exposure light outside a pattern formation area of said another mask.

15. A method of manufacturing an electronic circuit device according to claim 14, wherein the halftone phase-shift mask is used in a gate formation process for the electronic circuit device or a wiring formation process for the electronic circuit device, and the photomask with the metal film is used in a conductive hole formation process.

16. A method of manufacturing an electronic circuit device according to claim 1, wherein the resist shade film surrounds the pattern formation area.

17. A method of manufacturing an electronic circuit device according to claim 3, wherein the resist shade film surrounds the second pattern formation area.

18. A method of manufacturing an electronic circuit device according to claim 4, wherein the resist shade film surrounds the pattern formation area of the halftone phase-shift mask.

19. A method of manufacturing an electronic circuit device according to claim 5, wherein the resist shade film surrounds the second pattern formation area.

20. A method of manufacturing an electronic circuit device according to claim 7, wherein said resist shade film surrounds the pattern formation area of the halftone phase-shift mask.

21. A method of manufacturing an electronic circuit device according to claim 9, wherein the resist shade film surround the pattern formation area.

22. A method of manufacturing an electronic circuit device to claim 10, wherein the resist shade film surrounds the pattern formation area.

23. A method of manufacturing an electronic circuit device according to claim 11, wherein the resist shade film surrounds the pattern formation area.

24. A method of manufacturing an electronic circuit device according to claim 12, wherein the resist shade film surrounds the pattern formation area.

25. A method of manufacturing an electronic circuit device according to claim 13, wherein the resist shade film surrounds the pattern formation area of the first photomask.

26. A method of manufacturing an electronic device according to claim 14, wherein the resist shade film surrounds the pattern formation area of the halftone phase-shift mask.

* * * * *

Disclaimer

6,660,438—Toshihiko, Tanaka, Tokyo (JP); Norio Hasegawa, Hinode (JP). METHOD OF MANUFACTURING AN ELECTRONIC DEVICE AND A SEMICONDUCTOR INTEGRATED CIRCUIT DEVICE. Patent dated Dec. 9, 2003. Disclaimers filed Jan. 11, 2006, by the assignee, Reneas Technology Corporation.

Hereby enters this disclaimer to claims 1-26, of said patent.

*Official Gazette, March 21, 2006*